United States Patent [19]

Segawa et al.

[11] Patent Number: 5,510,785
[45] Date of Patent: Apr. 23, 1996

[54] METHOD OF CODING A DIGITAL SIGNAL, METHOD OF GENERATING A CODING TABLE, CODING APPARATUS AND CODING METHOD

[75] Inventors: Yoshihisa Segawa, Kanagawa; Kazuko Segawa, Himeji; Takuya Kitamura; Yoshihiro Murakami, both of Kanagawa, Japan

[73] Assignee: Sony Corporation, Tokyo, Japan

[21] Appl. No.: 214,215

[22] Filed: Mar. 17, 1994

[30] Foreign Application Priority Data

Mar. 19, 1993 [JP] Japan .................................. 5-060286

[51] Int. Cl.$^6$ .................................................. H03M 7/40
[52] U.S. Cl. ........................ 341/67; 341/106; 341/65
[58] Field of Search ............................ 341/63, 65, 106, 341/50, 67

[56] References Cited

U.S. PATENT DOCUMENTS

| | | | |
|---|---|---|---|
| 4,596,039 | 6/1986 | Mitchell et al. | 382/56 |
| 4,626,829 | 12/1986 | Hauck | 341/63 |
| 4,901,075 | 2/1990 | Vogel | 341/63 |
| 4,908,862 | 3/1990 | Kaneko et al. | 380/28 |
| 4,953,020 | 8/1990 | De With | 358/133 |
| 5,006,931 | 4/1991 | Shirota | 358/133 |
| 5,049,880 | 9/1991 | Stevens | 341/63 |
| 5,086,439 | 2/1992 | Asai et al. | 375/122 |
| 5,140,322 | 8/1992 | Sakagami | 341/65 |
| 5,166,686 | 11/1992 | Sugiyama | 341/155 |
| 5,227,789 | 7/1993 | Barry et al. | 341/65 |
| 5,355,133 | 10/1994 | Shimpuku et al. | 341/58 |
| 5,381,144 | 1/1995 | Wilson et al. | 341/63 |

FOREIGN PATENT DOCUMENTS 0439624  8/1991  European Pat. Off. .

OTHER PUBLICATIONS

Communications of the Association for Computing Machinery, vol. 34, No. 4, Apr. 1991, New York US pp. 31–44 Wallace ' the JPEG still picture compression standard'.

Primary Examiner—Marc S. Hoff
Attorney, Agent, or Firm—William S. Frommer; Alvin Sinderbrand

[57] ABSTRACT

Generating a plurality of tables based on a condition series, such as non-zero coefficient size groupings, by repeatedly executing an operation in which the quantization step of a quantizer is controlled by supplying the total code word length generated by a variable length coder to the quantizer. Coefficient data is coded by selecting a table based on a preceding condition series and the current condition series is coded based on the selected table. Thus, the total code word length is decreased. The coding apparatus includes a Huffman table generating apparatus, a transform circuit, a quantizer, and a variable length coder having a memory for storing the Huffman tables for every condition series.

12 Claims, 26 Drawing Sheets

FIG. 1 (PRIOR ART)

| DC Coefficient Data | AC 0 1 | AC 0 2 | AC 0 3 |
|---|---|---|---|
| AC 1 0 | AC 1 1 | AC 1 2 | AC 1 3 |
| AC 2 0 | AC 2 1 | AC 2 2 | AC 2 3 |
| AC 3 0 | AC 3 1 | AC 3 2 | AC 3 3 |

FIG. 3 (PRIOR ART)

| 0 Run (Number of Consecutive Zeros) | Coefficient Value Following 0 | Variable Length Code to be Assigned |
|---|---|---|
| 0 | 120 | C1 |
| 0 | 50 | C2 |
| 3 | 4 | C3 |
| 2 | 3 | C4 |
| 0 | 1 | C5 |
| 2 | 1 | C6 |
| 0 | 1 | C7 |
| 0 | 1 | C8 |

FIG. 8

Condition Series (0 Run 0, Value 120)

| 0 Run | Value | Code |
|---|---|---|
| 0 | 1 ⋮ 255 | |
| 1 | 1 ⋮ 255 | |
| 2 | 1 ⋮ 255 | |
| 3 | 1 ⋮ 255 | |
| ⋮ | ⋮ | ⋮ |
| 4 | 1 ⋮ 255 | |

FIG. 9

| 0 Run | Value | Condition Series | Code |
|---|---|---|---|
| 0 | 120 |  | Code 1 |
| 0 | 50 | 0 Run 0, Value 120 | Code 2 |
| 0 | 10 | 0 Run 0, Value 50 | Code 3 |
| 0 | 20 | 0 Run 0, Value 10 | Code 4 |
| 0 | 30 | 0 Run 0, Value 20 | Code 5 |
| 0 | 41 | 0 Run 0, Value 30 | Code 6 |
| 0 | 10 | 0 Run 0, Value 41 | Code 7 |
| 0 | 10 | 0 Run 0, Value 10 | Code 8 |
| 0 | 3 | 0 Run 0, Value 10 | Code 9 |
| 0 | 1 | 0 Run 0, Value 3 | Code 10 |
| 2 | 1 | 0 Run 0, Value 1 | Code 11 |
| 0 | 1 | 0 Run 0, Value 1 | Code 12 |
| 0 | 1 | 0 Run 0, Value 1 | Code 13 |

FIG. 10

| Size | Value |
|---|---|
| 0 | 0 |
| 1 | -1,1 |
| 2 | -3,-2,2,3 |
| 3 | -7~-4,4~7 |
| 4 | -15~-8,8~15 |
| 5 | -31~-16,16~31 |
| 6 | -63~-32,32~63 |
| 7 | -127~-64,64~127 |
| 8 | -255~-128,128~255 |
| 9 | -511~-256,256~511 |
| 10 | -1023~-512,512~1023 |
| 11 | -2047~-1024,1024~2047 |
| 12 | -4095~-2048,2048~4095 |
| 13 | -8191~-4096,4096~8191 |

FIG. 12

| Size of Preceding Coefficient Data | Size of Present Coefficient Data | Code |
|---|---|---|
| 0 | 0 | 00 |
| 0 | 1 | 01 |
| 0 | 2 | 10 |
| 0 | 3 | 110 |
| 0 | 4 | 1110 |
| 0 | 5 | 11110 |
| 0 | 6 | 111110 |
| 0 | 7 | 1111110 |
| 0 | 8 | 11111110 |
| 0 | 9 | 1111111100 |
| 0 | 10 | 1111111101 |
| 0 | 11 | 1111111110 |
| 0 | 12 | 11111111110 |
| 0 | 13 | 11111111111 |

FIG. 13

| Size of Preceding Coefficient Data | Size of Present Coefficient Data | Code |
|---|---|---|
| 1 | 0 | 0 0 |
| 1 | 1 | 0 1 |
| 1 | 2 | 1 0 |
| 1 | 3 | 1 1 0 |
| 1 | 4 | 1 1 1 0 |
| 1 | 5 | 1 1 1 1 0 |
| 1 | 6 | 1 1 1 1 1 1 0 |
| 1 | 7 | 1 1 1 1 1 1 1 0 |
| 1 | 8 | 1 1 1 1 1 1 1 1 0 |
| 1 | 9 | 1 1 1 1 1 1 1 1 1 0 0 |
| 1 | 10 | 1 1 1 1 1 1 1 1 1 0 1 |
| 1 | 11 | 1 1 1 1 1 1 1 1 1 1 0 |
| 1 | 12 | 1 1 1 1 1 1 1 1 1 1 1 0 |
| 1 | 13 | 1 1 1 1 1 1 1 1 1 1 1 1 |

FIG. 14

| Size of Preceding Coefficient Data | Size of Present Coefficient Data | Code |
|---|---|---|
| 2 | 0 | 110 |
| 2 | 1 | 00 |
| 2 | 2 | 01 |
| 2 | 3 | 10 |
| 2 | 4 | 1110 |
| 2 | 5 | 11110 |
| 2 | 6 | 111110 |
| 2 | 7 | 1111110 |
| 2 | 8 | 111111110 |
| 2 | 9 | 11111111100 |
| 2 | 10 | 11111111101 |
| 2 | 11 | 11111111110 |
| 2 | 12 | 111111111110 |
| 2 | 13 | 111111111111 |

FIG. 15

| Size of Preceding Coefficient Data | Size of Present Coefficient Data | Code |
|---|---|---|
| 3 | 0 | 1 1 1 0 |
| 3 | 1 | 1 1 0 |
| 3 | 2 | 0 0 |
| 3 | 3 | 0 1 |
| 3 | 4 | 1 0 |
| 3 | 5 | 1 1 1 1 0 |
| 3 | 6 | 1 1 1 1 1 0 |
| 3 | 7 | 1 1 1 1 1 1 0 |
| 3 | 8 | 1 1 1 1 1 1 1 0 |
| 3 | 9 | 1 1 1 1 1 1 1 1 0 0 |
| 3 | 10 | 1 1 1 1 1 1 1 1 0 1 |
| 3 | 11 | 1 1 1 1 1 1 1 1 1 0 |
| 3 | 12 | 1 1 1 1 1 1 1 1 1 1 0 |
| 3 | 13 | 1 1 1 1 1 1 1 1 1 1 1 |

FIG. 16

| Size of Preceding Coefficient Data | Size of Present Coefficient Data | Code |
|---|---|---|
| 4 | 0 | 1110 |
| 4 | 1 | 010 |
| 4 | 2 | 011 |
| 4 | 3 | 00 |
| 4 | 4 | 10 |
| 4 | 5 | 110 |
| 4 | 6 | 11110 |
| 4 | 7 | 111110 |
| 4 | 8 | 1111110 |
| 4 | 9 | 1111111100 |
| 4 | 10 | 1111111101 |
| 4 | 11 | 1111111110 |
| 4 | 12 | 11111111110 |
| 4 | 13 | 11111111111 |

FIG. 17

| Size of Preceding Coefficient Data | Size of Present Coefficient Data | Code |
|---|---|---|
| 5 | 0 | 11110 |
| 5 | 1 | 1110 |
| 5 | 2 | 110 |
| 5 | 3 | 00 |
| 5 | 4 | 01 |
| 5 | 5 | 10 |
| 5 | 6 | 111110 |
| 5 | 7 | 1111110 |
| 5 | 8 | 11111110 |
| 5 | 9 | 1111111100 |
| 5 | 10 | 1111111101 |
| 5 | 11 | 1111111110 |
| 5 | 12 | 11111111110 |
| 5 | 13 | 11111111111 |

FIG. 18

| Size of Preceding Coefficient Data | Size of Present Coefficient Data | Code |
|---|---|---|
| 6 | 0 | 11110 |
| 6 | 1 | 1110 |
| 6 | 2 | 010 |
| 6 | 3 | 011 |
| 6 | 4 | 00 |
| 6 | 5 | 10 |
| 6 | 6 | 110 |
| 6 | 7 | 111110 |
| 6 | 8 | 11111110 |
| 6 | 9 | 111111110 |
| 6 | 10 | 11111111100 |
| 6 | 11 | 11111111101 |
| 6 | 12 | 11111111110 |
| 6 | 13 | 11111111111 |

FIG. 19

| Size of Preceding Coefficient Data | Size of Present Coefficient Data | Code |
|---|---|---|
| 7 | 0 | 11110 |
| 7 | 1 | 1010 |
| 7 | 2 | 1011 |
| 7 | 3 | 100 |
| 7 | 4 | 110 |
| 7 | 5 | 00 |
| 7 | 6 | 01 |
| 7 | 7 | 1110 |
| 7 | 8 | 111110 |
| 7 | 9 | 11111110 |
| 7 | 10 | 1111111100 |
| 7 | 11 | 1111111101 |
| 7 | 12 | 1111111110 |
| 7 | 13 | 1111111111 |

FIG. 20

| Size of Preceding Coefficient Data | Size of Present Coefficient Data | Code |
|---|---|---|
| 8 | 0 | 1 0 1 0 |
| 8 | 1 | 1 0 1 1 |
| 8 | 2 | 1 1 1 0 |
| 8 | 3 | 0 1 0 |
| 8 | 4 | 0 1 1 |
| 8 | 5 | 1 0 0 |
| 8 | 6 | 1 1 0 |
| 8 | 7 | 0 0 |
| 8 | 8 | 1 1 1 1 0 |
| 8 | 9 | 1 1 1 1 1 0 |
| 8 | 10 | 1 1 1 1 1 1 0 0 |
| 8 | 11 | 1 1 1 1 1 1 0 1 |
| 8 | 12 | 1 1 1 1 1 1 1 0 |
| 8 | 13 | 1 1 1 1 1 1 1 1 0 |

FIG. 21

| Size of Preceding Coefficient Data | Size of Present Coefficient Data | Code |
|---|---|---|
| 9 | 0 | 1110 |
| 9 | 1 | 000 |
| 9 | 2 | 001 |
| 9 | 3 | 010 |
| 9 | 4 | 011 |
| 9 | 5 | 100 |
| 9 | 6 | 101 |
| 9 | 7 | 110 |
| 9 | 8 | 11110 |
| 9 | 9 | 111110 |
| 9 | 10 | 11111100 |
| 9 | 11 | 11111101 |
| 9 | 12 | 11111110 |
| 9 | 13 | 111111110 |

FIG. 22

| Size of Preceding Coefficient Data | Size of Present Coefficient Data | Code |
|---|---|---|
| 10 | 0 | 1 1 1 1 1 1 1 1 0 |
| 10 | 1 | 1 1 1 1 1 1 1 0 |
| 10 | 2 | 1 1 1 1 1 1 0 |
| 10 | 3 | 1 1 1 1 1 0 |
| 10 | 4 | 1 1 1 0 0 |
| 10 | 5 | 1 1 1 0 1 |
| 10 | 6 | 1 0 1 0 |
| 10 | 7 | 1 0 0 |
| 10 | 8 | 1 1 0 |
| 10 | 9 | 0 0 |
| 10 | 10 | 0 1 |
| 10 | 11 | 1 0 1 1 |
| 10 | 12 | 1 1 1 1 0 |
| 10 | 13 | 1 1 1 1 1 1 1 1 0 |

FIG. 23

| Size of Preceding Coefficient Data | Size of Present Coefficient Data | Code |
|---|---|---|
| 11 | 0 | 111111110 |
| 11 | 1 | 11111110 |
| 11 | 2 | 1111110 |
| 11 | 3 | 111110 |
| 11 | 4 | 11010 |
| 11 | 5 | 11011 |
| 11 | 6 | 1100 |
| 11 | 7 | 1110 |
| 11 | 8 | 010 |
| 11 | 9 | 00 |
| 11 | 10 | 10 |
| 11 | 11 | 011 |
| 11 | 12 | 11110 |
| 11 | 13 | 1111111110 |

FIG.24

| Size of Preceding Coefficient Data | Size of Present Coefficient Data | Code |
|---|---|---|
| 12 | 0 | 11111110 |
| 12 | 1 | 1011111 |
| 12 | 2 | 1111110 |
| 12 | 3 | 101110 |
| 12 | 4 | 111110 |
| 12 | 5 | 10110 |
| 12 | 6 | 11110 |
| 12 | 7 | 1010 |
| 12 | 8 | 100 |
| 12 | 9 | 00 |
| 12 | 10 | 01 |
| 12 | 11 | 110 |
| 12 | 12 | 1110 |
| 12 | 12 | 1011110 |

FIG. 25

| Size of Preceding Coefficient Data | Size of Present Coefficient Data | Code |
|---|---|---|
| 13 | 0 | 11111110 |
| 13 | 1 | 1111110 |
| 13 | 2 | 111110 |
| 13 | 3 | 01110 |
| 13 | 4 | 01111 |
| 13 | 5 | 0110 |
| 13 | 6 | 1110 |
| 13 | 7 | 010 |
| 13 | 8 | 110 |
| 13 | 9 | 00 |
| 13 | 10 | 10 |
| 13 | 11 | 11110 |
| 13 | 12 | 111111110 |
| 13 | 13 | 1111111110 |

FIG. 26

| Size of Present Coefficient | Code |
|---|---|
| 0 | 0 0 0 |
| 1 | 0 0 1 |
| 2 | 0 1 0 |
| 3 | 0 1 1 |
| 4 | 1 0 |
| 5 | 1 1 0 |
| 6 | 1 1 1 0 |
| 7 | 1 1 1 1 1 0 |
| 8 | 1 1 1 1 1 1 0 |
| 9 | 1 1 1 1 1 1 1 0 |
| 10 | 1 1 1 1 1 1 1 1 0 0 |
| 11 | 1 1 1 1 1 1 1 1 0 1 |
| 12 | 1 1 1 1 1 1 1 1 1 0 |
| 13 | 1 1 1 1 1 1 1 1 1 1 |
| 14 | 1 1 1 1 0 |

METHOD OF CODING A DIGITAL SIGNAL, METHOD OF GENERATING A CODING TABLE, CODING APPARATUS AND CODING METHOD

BACKGROUND OF THE INVENTION

1. Field of the Invention

The present invention relates to a coding apparatus for use with an apparatus for transmitting or recording and reproducing a variety of information, for example, video and audio signals or the like.

2. Description of the Prior Art

A variety of video signal coding apparatus have hitherto been proposed to transmit or record an image at a bit rate as low as possible with a sufficiently high picture quality. For example, there has been known a high-efficiency coding apparatus using a DCT (discrete cosine transform) and Huffman coding.

In conventional coding apparatus, data, such as video and audio data, to be coded is converted into coefficient data by a discrete cosine transform (DCT) circuit, for example, at every block from a DC component to a high-order AC component. The coefficient data is then quantized and subsequently coded by a variable length coder.

The DCT circuit converts the frequency component data, from a DC component, to a high-order AC component of the blocked data into two-dimensional coefficient data. The converted coefficient data is scanned (in a so-called zigzag scan fashion) and then coded, as shown in FIG. 1. Coding is carried out in accordance with the scanning order, and the coefficient data of the last coefficient which becomes non-zero after quantization lies within the coding range.

Coefficient data obtained within the coding range by the zigzag scanning are arrayed in a line as shown in FIG. 2, for example. The coefficient data thus arrayed are coded by the variable length coder according to a suitable method, such as the Huffman coding method or the like. U.S. Pat. No. 4,901,075 describes the Huffman coding technique.

In FIG. 2, DC represents the DC component coefficient data ("168" in this example), and AC01 through AC33 represent AC component coefficient data. The AC component coefficient data becomes high-order as their reference numeral increase. As shown in FIG. 2, the DC component coefficient data DC to the high-order AC component coefficient data ACC33 are coded as codes C1 to Cn, in that order. Also, as shown in FIG. 2, when coefficient data are coded, they are coded as a unit of consecutive "0"s and the succeeding value. In the following description, "0 run" means the number of consecutive "0"s. The expression of "0 run 0" shows that the length of the "0 run" is "0", i.e., there exists no "0".

In FIG. 2, AC component coefficient data AC20is "0", the next AC component coefficient data AC11 is "0", the next AC component coefficient data AC02 is "0" and the next AC component coefficient data AC03 is "4", which therefore will be referred to as "0 run 3, value 4". AC component coefficient AC01 is "120" and therefore will be referred to as "0 run 0, value 120".

How to code the coefficient data shown in FIG. 2 will be described below with reference to FIG. 3. FIG. 3 is a table to which reference will be made in assigning codes in response to the 0 run length and the value following the string of "0"s. To understand the prior art more clearly, FIG. 3 illustrates only 0 run lengths and their succeeding coefficient values. The table shown in FIG. 3 is made in accordance with the conventional Huffman code forming procedure.

AC component coefficient data AC01 is "120" as shown in FIG. 2, and described as "0 run 0, coefficient value 120" as shown in FIG. 3. Therefore, a variable length code C1 is assigned thereto, for example. AC component coefficient data AC10 is "50" as shown in FIG. 2, and described as "0 run 0, coefficient value 50" in FIG. 3. Therefore, a variable length code C2 is assigned thereto, as shown in FIG. 3.

The next AC component coefficient data AC20is "0", the AC component coefficient data AC11 is "0", the AC component coefficient data AC02 is "0" and the succeeding AC component data AC03 is "4", i.e., three consecutive "0"s are followed by "4", which is, a non-zero coefficient. In this case, as shown in FIG. 3, "0 run 3, coefficient value 4" is established and a variable length code C3 is assigned thereto. Similarly, AC component coefficient data AC12 is "0", the AC component coefficient data AC21 is "0", and the succeeding Ac component coefficient data AC30 is "3". In this case, as shown in FIG. 3, "0 run 2, coefficient value 3" is established and a variable length code C4 is assigned thereto.

Subsequently, AC component coefficient data AC31 is "1" and "0 run 0, coefficient value 1" is established as shown in FIG. 3. Thus, a variable length code C5 is assigned thereto. AC component coefficient data AC22 is "0", the AC component coefficient data AC13 is "0" and the succeeding AC component coefficient data AC23 is "1". In this case, as shown in FIG. 3, "0 run 2, coefficient value 1" is established and a variable length code C6 is assigned thereto. AC component coefficient data AC32 is "1", therefore, "0 run 0, coefficient value 1" is established and a variable length code C7 is assigned thereto. Similarly, AC component coefficient data AC33 is "1", so "0 run 0, coefficient value 1" is established, as shown in FIG. 3, and a variable length code C8 is assigned thereto.

As described above, in the conventional coding apparatus, the coding range of the coefficient data is determined by scanning from the DC component to the high-order AC component of the coefficient data obtained from the DCT circuit in a zigzag scanning fashion. Coefficient data which falls in the coding range are arrayed in a line in the order of zigzag scanning. Then, the coefficient data thus arrayed are coded based on the table made in accordance with the Huffman code forming procedure, i.e., a table formed of the number of consecutive "0"s and codes corresponding to the values of non-zeros following the consecutive "0"s.

The assignee of the present application has previously proposed the data transmission apparatus (see U.S. Pat. No. 5,006,931) which will be described below.

According to the previously-proposed data transmission apparatus, a two-dimensional image block formed of (n×n) pixels is coded by a suitable code conversion method, such as a cosine transform or the like. The DC component obtained by the coding is transmitted in a predetermined bit number. The (n square−1) AC components are divided into (m×m) (n>m) sub blocks. Address information of a sub block having purposive data and purposive coefficient data within the sub block are transmitted (for each sub block), whereby a transmission data amount can be made smaller than a predetermined target value under feedforward control.

Furthermore, according to the previously-proposed data transmission apparatus, a two-dimensional image block formed of (n×n) pixels is coded by a suitable code conversion method, such as a cosine transform or the like. The DC component obtained by the coding is transmitted in a predetermined bit number. The frequency with which (n square–1) AC components occur in the unit period, such as one field, one frame or the like, is detected. Then, the frequency of occurrence detected is converted into accumulative distribution data and the amount of data generated during the unit period is controlled so as to be smaller than a target amount of transmission data by using the accumulative distribution data (see U.S. Pat. No. 5,006,931).

As described above, in the conversion coding, such as a DCT or the like, coefficient data from low-order coefficient data to high-order coefficient data within the block are scanned in a zigzag fashion and consecutive "0"s and numbers other than "0" are formed as a group to which codes that are uniquely determined are assigned. Also in the subband coding, it is customary that codes which are uniquely determined are assigned to a group of consecutive "0"s within the band or between the bands and consecutive coefficients.

According to the aforesaid methods, when there are many consecutive "0"s efficient coding is possible. However, when there are not many consecutive "0"s, efficient coding is not possible.

OBJECTS AND SUMMARY OF THE INVENTION

It is therefore an object of the present invention to provide a coding apparatus having a high compression ratio.

It is another object of the present invention to provide a coding apparatus in which a coding table is converted in response to condition series.

According to a first aspect of the present invention, there is provided a method of coding a digital signal which is comprised of the steps of (a) converting a digital signal into a data series formed of consecutive zero coefficients and non-zero coefficients, (b) obtaining from the data series a plurality of events formed of consecutive zero coefficients having a predetermined run length and at least one non-zero coefficient being continued before or after the consecutive zero coefficients, and (c) setting a code word to the plurality of events on the basis of table data for adding different code words to respective events at every preceding events.

According to a second aspect of the present invention, there is provided a method of generating coding tables which is comprised of the steps of (a) converting a predetermined digital signal into a data series formed of consecutive zero coefficients and non-zero coefficients, (b) obtaining from the data series a plurality of events formed of consecutive zero coefficients having a predetermined run length and at least one non-zero coefficient being continued before or after said consecutive zero coefficients, (c) detecting a frequency at which next events occur from the plurality of events, and (d) generating table data used when a desired data series is coded in response to the state of preceding data series in response to the occurrence frequency of the events and storing the same in a memory.

According to a third aspect of the present invention, there is provided a method of coding a digital signal which is comprised of the steps of (a) converting a predetermined digital signal into a data series formed of consecutive zero coefficients and non-zero coefficients, (b) obtaining from the data series a plurality of events formed of consecutive zero coefficients having a predetermined run length and at least one non-zero coefficient being continued before or after said consecutive zero coefficients, (c) detecting a frequency at which next events occur from the plurality of events, (d) generating table data used when a desired data series is coded in response to the state of preceding data series in response to the occurrence frequency of the events obtained at the step (c) and storing the same in a memory, (e) converting an arbitrary digital signal into data series formed of consecutive zero coefficients and consecutive non-zero coefficients, (f) obtaining the events from the data series obtained at the step (e), and (g) determining one code word to a plurality of events obtained at the step (f) on the basis of the table data.

According to a fourth aspect of the present invention, there is provided a coding apparatus which is comprised of a converter for converting a digital signal into a data series formed of consecutive zero coefficients and non-zero coefficients, a memory for storing therein a plurality of table data representing code words added to next events in response to a plurality of events formed of consecutive zero coefficients having a predetermined run length and at least one non-zero coefficient being continued before or after the consecutive zero coefficients, and a coder for obtaining a plurality of events from the data series and adding a code word to the plurality of events on the basis of the table data.

According to a fifth aspect of the present invention, there is provided a method of coding a digital signal which is comprised of the steps of (a) converting a predetermined digital signal into a data series formed of consecutive zero coefficients and non-zero coefficients, (b) classifying the non-zero coefficients into a plurality of groups in response to values of the non-zero coefficients, (c) obtaining from the data series a plurality of events formed of consecutive zero coefficients having a predetermined run length and at least one non-zero coefficient being continued before or after the consecutive zero coefficients, and (d) determining one code word for the plurality of events on the basis of table data for adding code words to events at every groups of preceding events.

According to a sixth aspect of the present invention, there is provided a method of coding a digital signal which is comprised of the steps of (a) converting a predetermined digital signal into a data series formed of consecutive zero coefficients and non-zero coefficients, (b) obtaining from the data series a plurality of events formed of consecutive zero coefficients having a predetermined run length and at least one non-zero coefficient being continued before or after the consecutive zero coefficients, (c) classifying the non-zero coefficients into a plurality of groups in response to values of the non-zero coefficients, (d) detecting a frequency at which next events occur from each of the groups, (e) generating table data used when a desired series is coded in response to the state of preceding data series in response to an occurrence frequency of each of the events and storing the same in a memory, (f) converting an arbitrary digital signal into a data series formed of consecutive zero coefficients and non-zero coefficients, obtaining each of the events from the data series obtained in the (f), and (h) determining one code word for a plurality of events obtained in the step As a seventh aspect of the present invention, a coding apparatus is comprised of a converter for converting a digital signal into a data series formed of consecutive zero coefficients and non-zero coefficients, a classifying circuit for classifying the non-zero coefficients into a plurality of groups in response to values of the non-zero coefficients, a memory for storing therein a plurality of table data expressing code words added to a plurality of events formed of consecutive zero coefficients having a predetermined run length and at least one non-zero coefficient being continued before or after the consecutive zero coefficients in response to the next events generated in response to each group, and a coder supplied with the plurality of events from the data series and adding one code word to the plurality of events on the basis of the table data.

As an eighth aspect of the present invention, a coding apparatus is comprised of a converter for converting a digital signal into a data series of a predetermined form, a memory for storing therein a plurality of table data selected on the basis of the previously-coded data series, and a coder for coding the data series on the basis of table data selected in response to the previously-coded data series.

The above and other objects, features, and advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIG. 1 illustrates a conventional coding system using a discrete cosine transform scanning method;

FIG. 3 illustrates how to code coefficient data in a conventional coding system;

FIG. 8 illustrates how the coding apparatus according to an embodiment of the present invention uses a table corresponding to the condition series (zero-run, value);

FIG. 9 illustrates how the coding apparatus according to an embodiment of the present invention determines codes based on the coefficient data values and the condition series;

FIG. 10 illustrates a coding table, according to the embodiment of the present invention, that is used to determine sizes of the coefficient data;

FIG. 12 is an embodiment of a coding table corresponding to size "0";

FIG. 13 is an embodiment of a coding table corresponding to size "1";

FIG. 14 is an embodiment of a coding table corresponding to size "2";

FIG. 15 is an embodiment of a coding table corresponding to size "3";

FIG. 16 is an embodiment of a coding table corresponding to size "4";

FIG. 17 is an embodiment of a coding table corresponding to size "5";

FIG. 18 is an embodiment of a coding table corresponding to size "6";

FIG. 19 is an embodiment of a coding table corresponding size "7";

FIG. 20 is an embodiment of a coding table corresponding to size "8";

FIG. 21 is an embodiment of a coding table corresponding to size "9";

FIG. 22 is an embodiment of a coding table corresponding to size "10";

FIG. 23 is an embodiment of a coding table corresponding to size "11";

FIG. 24 is an embodiment of a coding table corresponding to size "12";

FIG. 25 is an embodiment of a coding table corresponding to size "13"; and

FIG. 26 is an embodiment of a table used to convert leading the coefficient data of an AC component.

DETAILED DESCRIPTION OF THE PREFERRED EMBODIMENTS

Figure 2:
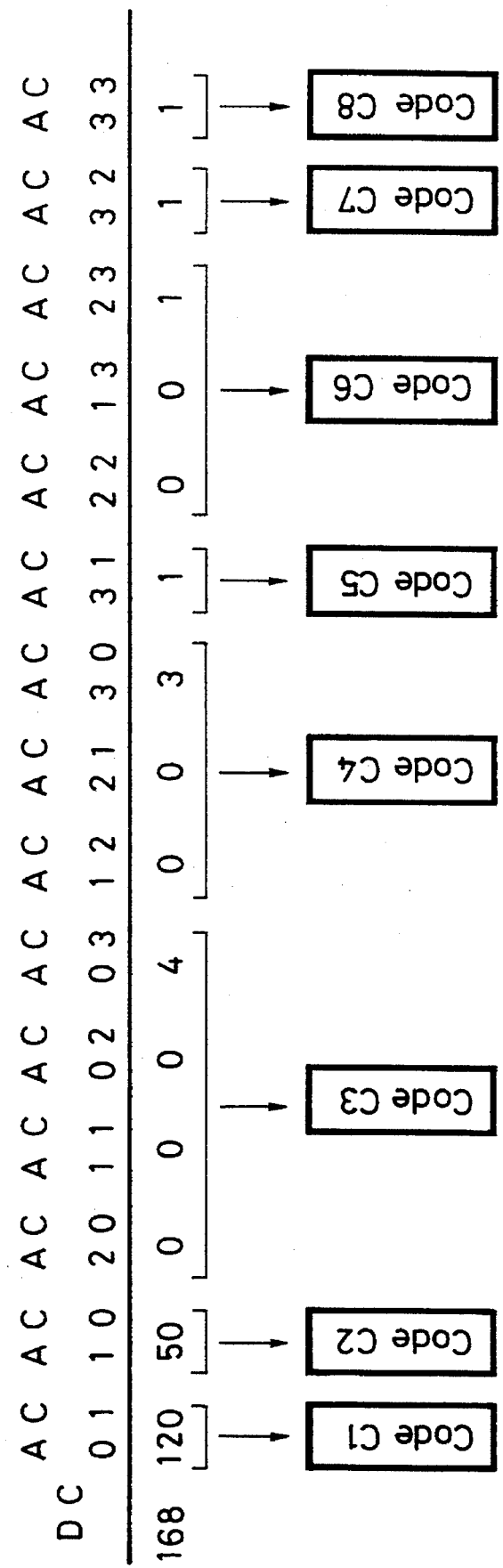
FIG. 2 illustrates how to determine a code in a conventional coding system based on consecutive "0"s and a coefficient value following the "0"s.

Referring now to the drawings in detail, and initially to FIGS. 4A and 4B, a coding apparatus according to an embodiment of the present invention will be described below.

A high-efficiency coding apparatus will be described with reference to FIGS. 4A and 4B. FIG. 4A shows an encoder of the high-efficiency coding apparatus and FIG. 4B shows a decoder thereof.

The encoder will be described with reference to FIG. 4A. As shown in FIG. 4A, image data from an electronic device, such as a digital video tape recorder (digital VTR) or the like, is supplied to input terminal 1. The image data supplied to the input terminal is input to transform circuit 2.

The transform circuit might be a discrete cosine transform (DCT) circuit, for example. The transform circuit processes the image data supplied thereto from the input terminal 1 by transforming every block in a DCT fashion to obtain frequency components from a DC component to high-order AC components of coefficient data. The orthogonal transform might be a Fourier transform, Hadamard transform, and Karhuen-Loéve transform, for example. The orthogonal transform can become complicated, therefore, there might be considered other transform systems, such as the slant transform and Haar transform. In this embodiment, a high-speed calculation algorithm exists, which can be realized by a one-chip LSI (large scale integrated circuit), thus making it possible to effect a real time transform of image data. Further, this embodiment uses a DCT which is excellent in transforming low frequency components, which directly affects the coding efficiency of the apparatus or method.

Figure 7:
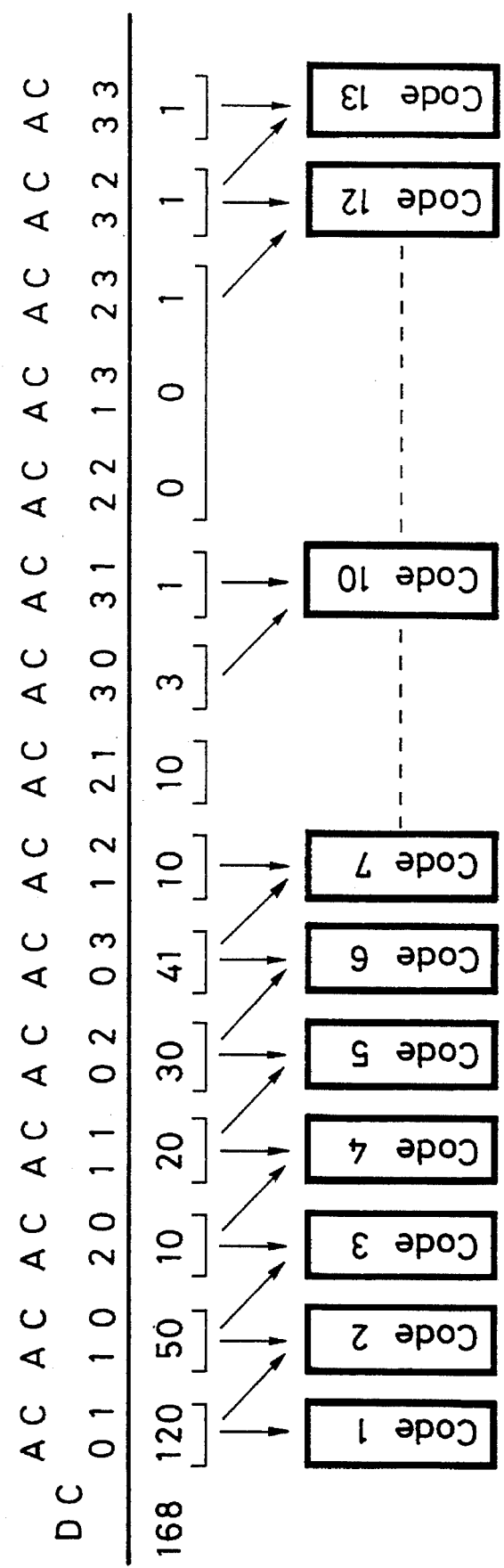
FIG. 7 illustrates how a coding apparatus according to the present invention determines which codes to assign to the coefficient data.

The image data processed by transform circuit 2 is the coefficient data, which is supplied to quantizer 3. The quantizer quantizes the coefficient data supplied from the transform circuit. The quantized coefficient data is then supplied to variable length coder (VLC) 4. The variable length coder codes the quantized coefficient data supplied from the quantizer by the scanning technique (zigzag scanning) which was noted earlier with reference to FIG. 1. The variable length coder arrays the coefficient data provided within the coding range as shown in FIG. 7, and codes the coefficient data thus arrayed in a Huffman coding method.

This embodiment prepares a plurality of tables corresponding to a condition series for coding coefficient data thus arrayed. When some coefficient data are coded, a table corresponding to the condition of the preceding coefficient data is selected and the coefficient data to be coded is coded based on the selected table. In transform coding, the converted coefficient data are correlated with each other. Therefore, the coding efficiency can be improved considerably if the coefficient data is coded by using the correlation.

Figure 5:
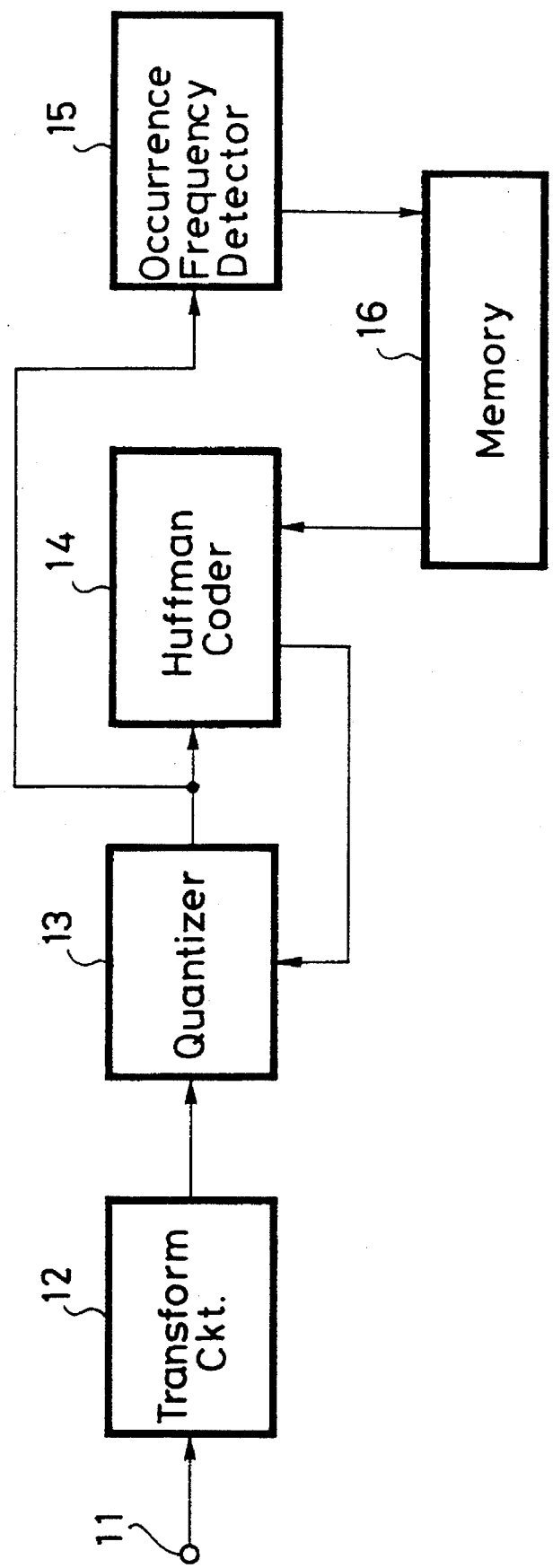
FIG. 5 is a schematic block diagram of a Huffman table generating apparatus, illustrating a method of generating a coding table according to the embodiment of the present invention.

FIG. 5 shows an apparatus for making such tables, i.e., a Huffman table generating apparatus to which there is applied a method of generating a coding table according to the present invention.

As shown in FIG. 5, video signals of the same content are supplied at a predetermined cycle, for example, to input terminal 11 from the outside. The video signal from the outside is supplied through the input terminal to a transform circuit 12. The transform circuit processes the video signal in a suitable transform fashion, such as a DCT or the like, and supplies the processed video signal to quantizer 13.

The quantizer quantizes the signal output from transform circuit 12, i.e., the coefficient data, and supplies the quantized coefficient data to Huffman coder 14. The Huffman coder codes the quantized coefficient data in a Huffman coding fashion based on a table stored in memory 16 and supplies the total code length data to quantizer 13. The total code length data supplied to the quantizer is used to vary a coarseness of quantization. Memory 16 is formed of a read circuit, a write circuit and a memory circuit, such as a DRAM (dynamic random access memory), a SRAM (static random access memory) or the like.

On the other hand, the coefficient data from quantizer 13 is also supplied to occurrence frequency detector 15. The occurrence frequency detector detects an occurrence frequency of the coefficient data supplied from the quantizer and generates table data based on the detected frequencies, so that the table data are coded within the total code length according to the Huffman coding manner. The table data thus generated is supplied to memory 16.

Operation of the Huffman table generating apparatus shown in FIG. 5 will be described below. A video signal that is used to generate table data of a predetermined length, for example, is repeatedly supplied to input terminal 11. Table data that had been randomly selected are loaded in advance in memory 16 from occurrence frequency detector 15 as an initial value.

Quantizer 13 quantizes the video signal used to generate table data of the predetermined length with a coarseness based on initial control data from Huffman coder 14. Then, the quantizer supplies the quantized coefficient data to the Huffman coder and occurrence frequency detector 15, respectively. The Huffman coder codes the coefficient data based on the table data loaded in memory 16 as an initial value.

The occurrence frequency detector detects the occurrence frequency of coefficient data supplied from quantizer 13 and generates new table data based on the detected frequency of the data, so that the new table data may fall within the total code length. Then, the new table data are loaded into memory 16.

To detect the occurrence frequency is to detect the probability at every condition series that a group of 0 run and value occurs. Further, the condition series is "0 run, value (coefficient value)" that was converted just before. Groups of codes for every condition series are made by using the occurrence probability in accordance with the Huffman coding method. This method is known such that symbols (groups of 0 run and value of coefficient data) are arranged in the sequential order of the large occurrence probability, "1" and "0" are arbitrarily assigned to a symbol having the smallest occurrence probability and a symbol having the second smallest occurrence probability and that these two symbols are assumed to be one symbol. Then, the number of symbols is reduced by using the occurrence probability of the combined symbols as a sum of the occurrence probabilities before being combined. This symbol is considered as a new information source and the process in which symbols are rearranged in the sequential order of large occurrence probabilities is repeated until the symbol becomes "1". When the symbol becomes "1", "1" and "0" which had initially been assigned to respective symbols are read out in the reverse order. Thus, they are used as codes for the symbols.

There is a tendency that, when one of the absolute values of the coefficient data within the DCT block is large, absolute values of the other coefficient data are also large and that, when one of them is small, absolute values of the other coefficient data are also small. Thus, coefficient data are correlated with each other. That is, the frequency with which 0 run and groups of coefficient data values appear changes depending upon the condition series. Therefore, it is possible to decrease the total code length by assigning variable length codes based on this correlation.

When new table data are loaded onto memory 16, Huffman coder 14 codes the coefficient data supplied from quantizer 13 based on the new table data, and also supplies the total code length data to the quantizer, thereby varying a quantization coarseness of the quantizer. Similarly, the Huffman coder codes table forming data of predetermined lengths based on the new tables, and then supplies the resulting total code length data to quantizer 13 so that the quantization coarseness of the quantizer is varied based on the total code length data. Then, new table data are generated by detecting the occurrence frequency of the coefficient data, and the coefficient data are coded by using the resultant new table data. A number of coding tables corresponding to the above-mentioned condition series are made by repeating a series of the above-mentioned operation.

Figures 4A, 4B:
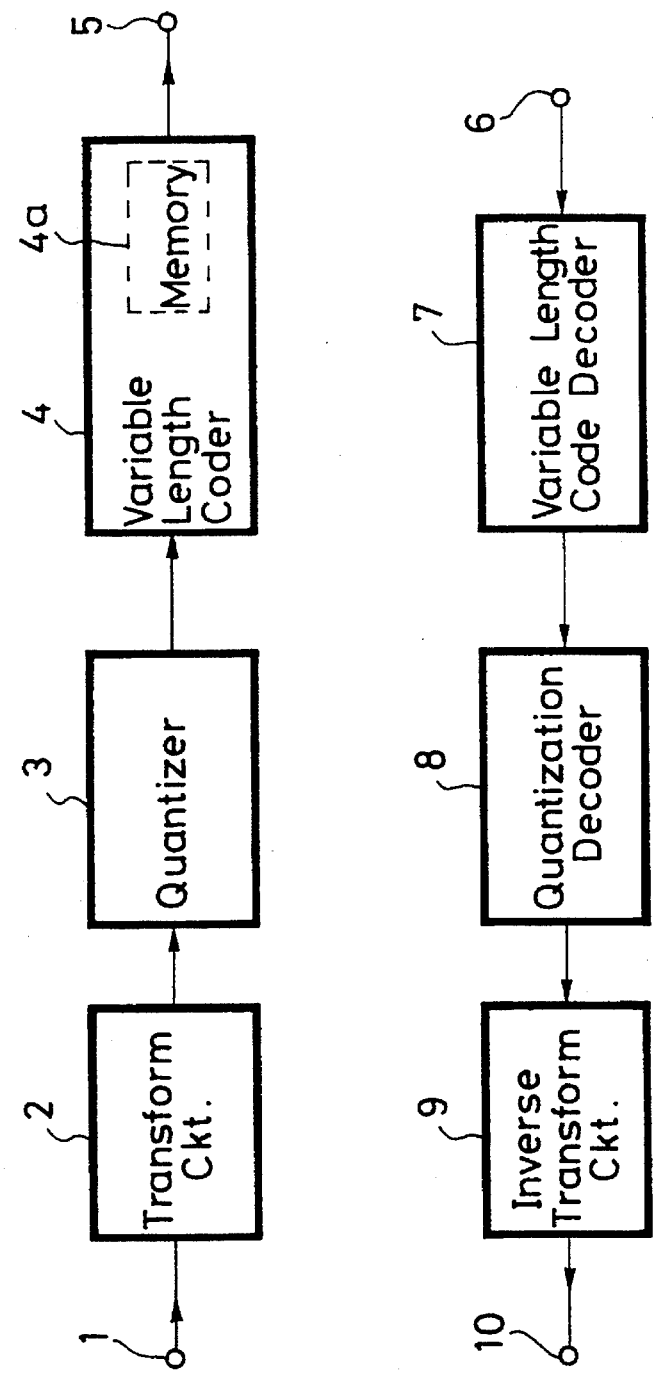
FIGS. 4A and 4B are schematic block diagrams showing a high-efficiency coding and decoding apparatus accorrding to an embodiment of the present invention, respectively.

The table data thus made are stored in memory 4a of variable length coder 4 in the encoder of the high-efficiency coding apparatus shown in FIG. 4A. Memory 4a might be formed of an EEPROM (electrically erasable and programmable ROM), a RAM having a backup function, PROM (programmable ROM), a one-time ROM or the like. The table data are stored in the memory according to, for example, a method in which the table data are written by an apparatus to the memory and the memory is mounted on variable length coder 4, and a method in which the table data are loaded onto the memory of the variable length coder from the Huffman table generating apparatus shown in FIGS. 5 and 6.

Figure 6:
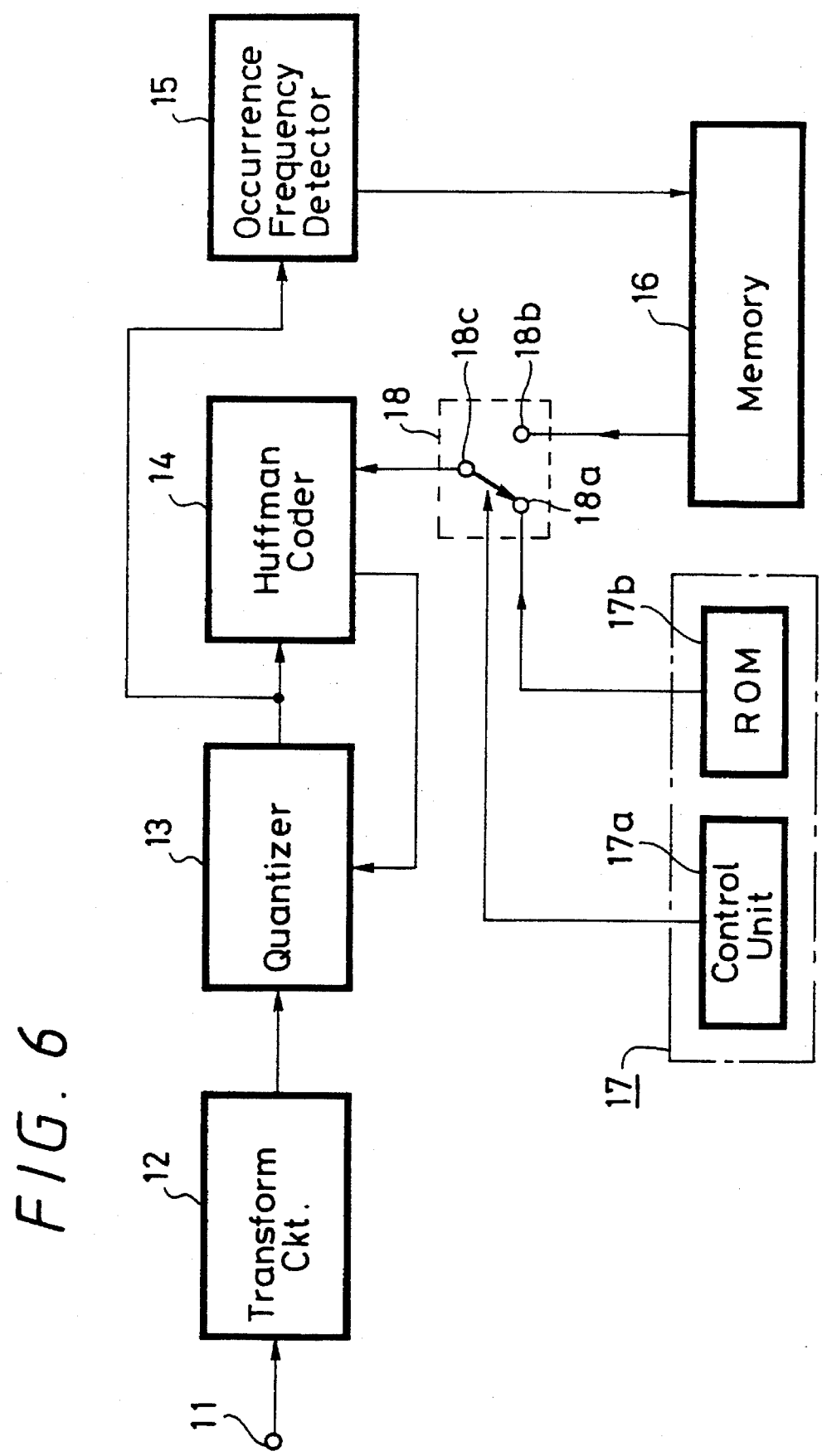
FIG. 6 is a schematic block diagram of a Huffman coding table generating apparatus, illustrating a method of generating a coding table according to another embodiment of the present invention.

FIG. 6 is a block diagram showing a specific arrangement of the Huffman table generating apparatus shown in FIG. 5. In FIG. 6, like parts corresponding to those of FIG. 5 are marked with the same reference numerals and, therefore, need not be described in detail.

As shown in FIG. 6, there is provided controller 17 which is comprised of control unit 17a and ROM 17b. The table data provided as default values are stored in ROM 17b of the controller. When a power switch is turned on or a reset switch (not shown) is depressed, the control unit supplies a switching control signal to switch 18 so that the switch connects movable contact 18c to fixed contact 18a.

Movable contact 18c of the switch is connected to the input terminal of Huffman coder 14 and the other fixed contact 18b of the switch is connected to the output terminal of memory 16. Therefore, when movable contact 18c of the switch is connected to fixed contact 18a, the table data provided as the default values, stored in ROM 17b, are loaded into the Huffman coder through the switch. When movable contact 18c of the switch is connected to fixed contact 18b, the generated table data stored in memory 16 are loaded into the Huffman coder.

When the power switch of the apparatus is turned on or the reset switch thereof is depressed, movable contact 18c of the switch is connected to fixed contact 18a under the control of control unit 17a of controller 17, whereby the table data provided as the default values are supplied to Huffman coder 14 from ROM 17b. The Huffman coder codes the coefficient data from quantizer 13 based on the table data and also supplies the total code length data to the quantizer to vary the quantization coarseness in the quantizer.

When the new table data are loaded onto memory 16, switch 18 connects movable contact 18c to fixed contact 18b under the control of control unit 17a, whereby the new table data from memory 16 are supplied to Huffman coder 14. The Huffman coder codes the coefficient data from quantizer 13 based on the new table data and supplies the total code length data to the quantizer, thereby varying the quantization coarseness of the quantizer. Similarly, table generating data of a predetermined length are coded based on the table data which has been recently modified. Then, the total code length data thus obtained is supplied to the quantizer, thereby changing the quantization coarseness of the quantizer. Again, new table data are generated by detecting the occurrence frequency and the resultant new table data are coded. Subsequently, a number of coding tables corresponding to the above-mentioned condition series are created by repeating a series of the above-mentioned operation. The table data thus generated are stored in memory 4a of variable length coder 4 in the encoder of the high-efficiency coding apparatus shown in FIG. 4A.

The condition series under which the table data are generated as described above can be considered as the number of 0 run and the non-zero values. Now, a description will be given for the case in which the coefficient data, arrayed as shown in FIG. 7, are coded based on the table data corresponding to the respective condition series.

In FIG. 7, the reference symbol DC represents a DC component coefficient data which is "168" in this illustrated example. The AC component coefficient data, AC01 through AC33, becomes high-order as their reference numerals increase. As shown in FIG. 7, the DC component coefficient data DC to the high-order AC component coefficient data AC33 are sequentially coded to provide code 1 through code n. As shown in FIG. 7, the respective coefficient data are coded in response to consecutive "0"s and succeeding values. Similarly to FIG. 1, "0 run" is used as the term which represents the number of consecutive "0"s. Description of "0 run 0", for example, represents that the number of consecutive "0"s is 0, i.e., there are no "0"s.

As shown in FIG. 7, the AC component coefficient data AC22 is "0", AC component coefficient data AC13 is "0" and succeeding AC component coefficient data AC23 is "1", which provides "0 run 2, value 1". Also, the AC component coefficient data AC01 is "120" in this case, so "0 run 0, value 120" is established.

The coding of the coefficient data shown in FIG. 7 will be described with reference to FIG. 8. FIG. 8 shows a table of condition series "0 run 0, value 120". In this table, codes are assigned in response to lengths of 0 run and values of coefficient data in accordance with the condition series. The present invention is different from the prior art as follows. Initially, a number of tables are made in accordance with the Huffman code making procedure in response to the condition series. When some coefficient data is coded, a corresponding table is selected from a number of tables based on the condition series of the coefficient data preceding the current coefficient data to be coded. Then, the current coefficient data is coded based on the selected table.

FIG. 9 is a diagram which explains, based on the example of FIG. 7, that the table formed based on the condition series described in FIG. 8 is selected by the condition series of the coefficient data preceding the current coefficient data. Then, the coefficient data to be coded is coded based on the selected table.

As shown in FIGS. 7 and 9, the coefficient data AC01 of the value "120" is the leading AC component and, therefore, has no preceding condition series. Accordingly, for the coefficient data of the leading AC component, the variable length code 1 is obtained from a present value, i.e., the table (shown in FIG. 3) in which a code is assigned in response to 0 run length and value of the coefficient data. This table is the same as the conventional one.

The AC component coefficient data AC10 is "50", and the AC component coefficient data provided before the AC component coefficient data AC10 is AC01. The value of the AC component AC01 is "0 run 0 and coefficient value 120". Therefore, a table corresponding to this condition series is selected from a plurality of tables and a variable length code 2 is assigned to a value "50" of the coefficient data AC10 based on the selected table.

The next AC component coefficient data AC20 is "10" and the AC component coefficient data provided before the AC component data AC20 is AC10. The value of the AC component coefficient data AC10 is "0 run 0 and coefficient value 50". Therefore, a table corresponding to this condition series is selected from a plurality of tables and a variable length code 3 is assigned to a value "10" of the AC component coefficient data AC20 based on the selected table.

The next AC component coefficient data AC11 is "20" and the AC component coefficient data provided before the AC component coefficient data AC11 is AC20. The value of the AC component coefficient data AC20 is "0 run 0 and coefficient value 10". Therefore, a table corresponding to this condition series is selected from a plurality of tables and a variable length code 4 is assigned to a value "20" of the AC component coefficient data AC11 based on the selected table.

The next AC component coefficient data AC02 is "30" and the AC component coefficient data provided before the AC02 is AC11. The value of the AC component coefficient data AC11 is "0 run 0 and coefficient value 20". Therefore, a table corresponding to this condition series is selected from a plurality of tables and a variable length code 5 is assigned to a value "30" of the AC component coefficient data AC02 based on the selected table.

The next AC component coefficient data AC03 is "41" and the AC component coefficient data provided before the AC component coefficient data AC03 is AC02. The value of the AC component coefficient data AC02 is "0 run 0 and coefficient value 30". Therefore, a table corresponding to this condition series is selected from a plurality of tables and a variable length code 6 is assigned to a value "41" of the AC component coefficient data AC03 based on the selected table.

The next AC component coefficient data AC12 is "10" and the AC component coefficient data provided before the AC component coefficient data AC12 is AC03. The value of the AC component coefficient data AC03 is "0 run 0 and value 41". Therefore, a table corresponding to this condition series is selected from a plurality of tables and a variable length code 7 is assigned to a value "10" of the AC component coefficient data AC12 based on the selected table.

The next AC component coefficient data AC21 is "10" and the AC component coefficient data provided before the AC component coefficient data AC21 is AC12. The value of the AC component coefficient data AC12 is "0 run 0 and value 10". Therefore, a table corresponding to this condition series is selected from a plurality of tables and a variable length code 8 is assigned to a value "10" of the AC component coefficient data AC21 based on the selected table.

The next AC component coefficient data AC30 is "3" and the AC component coefficient data provided before the AC component coefficient data AC30 is AC21. The value of the AC component coefficient data AC21 is "0 run 0 and value 10". Therefore, a table corresponding to this condition series is selected from a plurality of tables and a variable length code 9 is assigned to a value "3" of the AC component coefficient data AC30 based on the selected table.

The next AC component coefficient data AC31 is "1" and the AC component coefficient data provided before the AC component coefficient data AC31 is AC30. The value of the AC component coefficient data AC30 is "0 run 0 and value 3". Therefore, a table corresponding to this condition series is selected from a plurality of tables and a variable length code 10 is assigned to a value "1" of the AC component coefficient data AC31 based on the selected table.

The AC component coefficient data AC22 is "0", the AC component coefficient data AC13 is "0", and the succeeding AC component coefficient data AC23 is "1". However, AC component coefficient data provided before the AC component coefficient data AC22 is AC31. The value of the AC component coefficient data AC31 is "0 run 0 and value 1". Therefore, a table corresponding to this condition series is selected from a plurality of tables. Then, a variable length code 11 is assigned to the value "0" of the AC component coefficient data AC22, the value "0" of the AC component coefficient data AC13 and the value "1" of the AC component coefficient data AC23 based on the selected table.

The next AC component coefficient data AC32 is "1", and the AC component coefficient data provided before the AC component coefficient data AC32 are AC22, AC13 and AC23. The values thereof are "0 run 2 and value 1". Therefore, a table corresponding to this condition series is selected from a plurality of tables. Then, a variable length code 12 is assigned to the value "1" of the AC component coefficient data AC32 based on the selected table.

Then, the AC component coefficient data AC33 is "1" and AC component coefficient data provided before the AC component coefficient data AC33 is AC32. The value of AC component coefficient data AC32 is "0 run 0 and value 1". Therefore, a table corresponding to this condition series is selected from a plurality of tables. Then, a variable length code 13 is assigned to the value "1" of the AC component coefficient data AC33 based on the selected table.

The encoder that encodes the coefficient data has been described so far. Next, the decoder in the high-efficiency coding apparatus of the present invention will be described with reference to FIG. 4B.

As shown in FIG. 4B, there is provided input terminal 6 to which there is supplied transmitted, reproduced or read-out data from a transmission line or output side of an electronic device (not shown). The encoded data supplied to this input terminal are input to variable length code decoder 7. The variable length code decoder decodes the variable length code data supplied through the input terminal to produce quantized coefficient data. The quantized coefficient data is then supplied to quantization decoder 8.

The quantization decoder decodes the quantized coefficient data to provide coefficient data that is not quantized. The resultant non-quantized coefficient data is supplied to inverse transform circuit 9. The inverse transform circuit carries an out inverse transform of the discrete cosine transform, the Hadamard transform or the like that was already described in connection with transform circuit 2. The original data thus output from the inverse transform circuit is supplied through output terminal 10 to a reproducing system or the like of an electronic device which contains this high-efficiency coding apparatus.

When the variable length code data is decoded by variable length code decoder 7, and the variable length code data is coded by using "0 run, value" as the condition series, the coding table which was used for coding the data should be used or the variable length code decoder 7 should include a table (coefficient data are respectively made corresponding to the coded data) that can be used to obtain the original coefficient data from the coded data.

As described above, according to this embodiment, the Huffman table generating apparatus is used, the table data are formed by detecting the occurrence frequency of the coefficient data quantized by quantizer 13, the coefficient data is then coded by Huffman coder 14 based on the table thus generated, and a quantization coarseness of the quantizer is controlled by supplying the total code length data from the Huffman coder to the quantizer. A number of tables based on the condition series (0 run, value) are formed by repeating a series of the above-mentioned operation. The tables thus created are loaded into memory 4a of variable length coder 4 in the encoder of the high-efficiency coding apparatus. When the coefficient data are coded by the high-efficiency coding apparatus, a table corresponding to the condition series of the coefficient data preceding the current coefficient data is selected and the current coefficient data to be coded are coded based on the selected table. Thus, the size of the total code length is decreased.

A plurality of tables based on the condition series generated by the Huffman table generating apparatus shown in FIGS. 5 and 6 can be written to or loaded into memory 4a of the variable length coder 4 in the high-efficiency coding apparatus shown in FIG. 4A as described above. The circuits connected to quantizer 13 shown in FIGS. 5 and 6, in the case of FIG. 5, Huffman coder 14, occurrence frequency detector 15 and memory 16, and in the case of FIG. 6, Huffman coder 14, occurrence frequency detector 15, the memory 16, controller 17 and switch 18, may also be incorporated within variable length coder 4 of FIG. 4A. In that case, memory 16 shown in FIGS. 5 and 6 can serve also as memory 4a shown in FIG. 4A.

The coding using other condition series (sizes) than the above-mentioned condition series ("0 run, value") will be described with reference to FIGS. 10 to 26. The "size" is the value of the power obtained when the value of the coefficient data is expressed by a power of 2. The "size" is used as an index for other tables when the coefficient data are classified into groups depending on the value of the coefficient data.

However, 2 to the eighth power is 256 and a maximum value expressed by 8 bits is 255 (11111111=255). Accordingly, when coefficient data are classified by "size" in actual practice, the range of the coefficient data when the coefficient value is expressed by a power of 2 is 2 to the power.

FIG. 10 is an example of how the coefficient data are classified based on the "size" concept. As shown in FIG. 10, a coefficient value "0" is classified as size 0 (2 to the power 0), a coefficient value "–1" and a coefficient value "1" are classified as size 1 (2 to the power 1), ..., coefficient values "–1023 to –512" and coefficient values "512 to 1023" are classified as size 10 (2 to the power 10). Also, coefficient values "–8191 to –4096" and "4096 to 8191" are classified as size 13 (2 to the power 13).

In this embodiment, coefficient data of the respective sizes are sequentially arranged in order from the low value coefficient data on the left to the high value on the right, for example, in FIG. 10. When the coefficient data are classified, it is assumed that Huffman coder 14 shown in FIGS. 5 and 6 has the table shown in FIG. 10. The sizes 0 to 13 shown on the table of FIG. 10 represent the power exponents, and the values of the coefficient data that fall within the respective ranges are assigned to these "sizes", 0 to 13. When a value of the coefficient data is "50", for example, this coefficient data value "50" falls within a range in which the power exponent is "6", i.e., 2 to the power 6=64. Accordingly, as shown in FIG. 10, the "size" established for a coefficient data of the value "50" is 6.

In this embodiment, values of the coefficient data are classified at every size and many tables corresponding to the coefficient data sizes are prepared in advance. Then, when some coefficient data are coded, a table corresponding to the size of preceding coefficient data is selected and a Huffman code is assigned to the coefficient data to be coded based on the selected table. While the "0 run, value" is used as the condition series as described before, in this embodiment, the "size" is used as the condition series. Similarly, the table corresponding to the condition series of the preceding coefficient data is selected and the coding is carried out based on the selected table.

How to make tables corresponding to condition series (sizes of the preceding coefficient data) by using the Huffman table generating apparatus shown in FIGS. 5 and 6 will be described with reference to the flowchart of FIG. 11.

Figure 11:
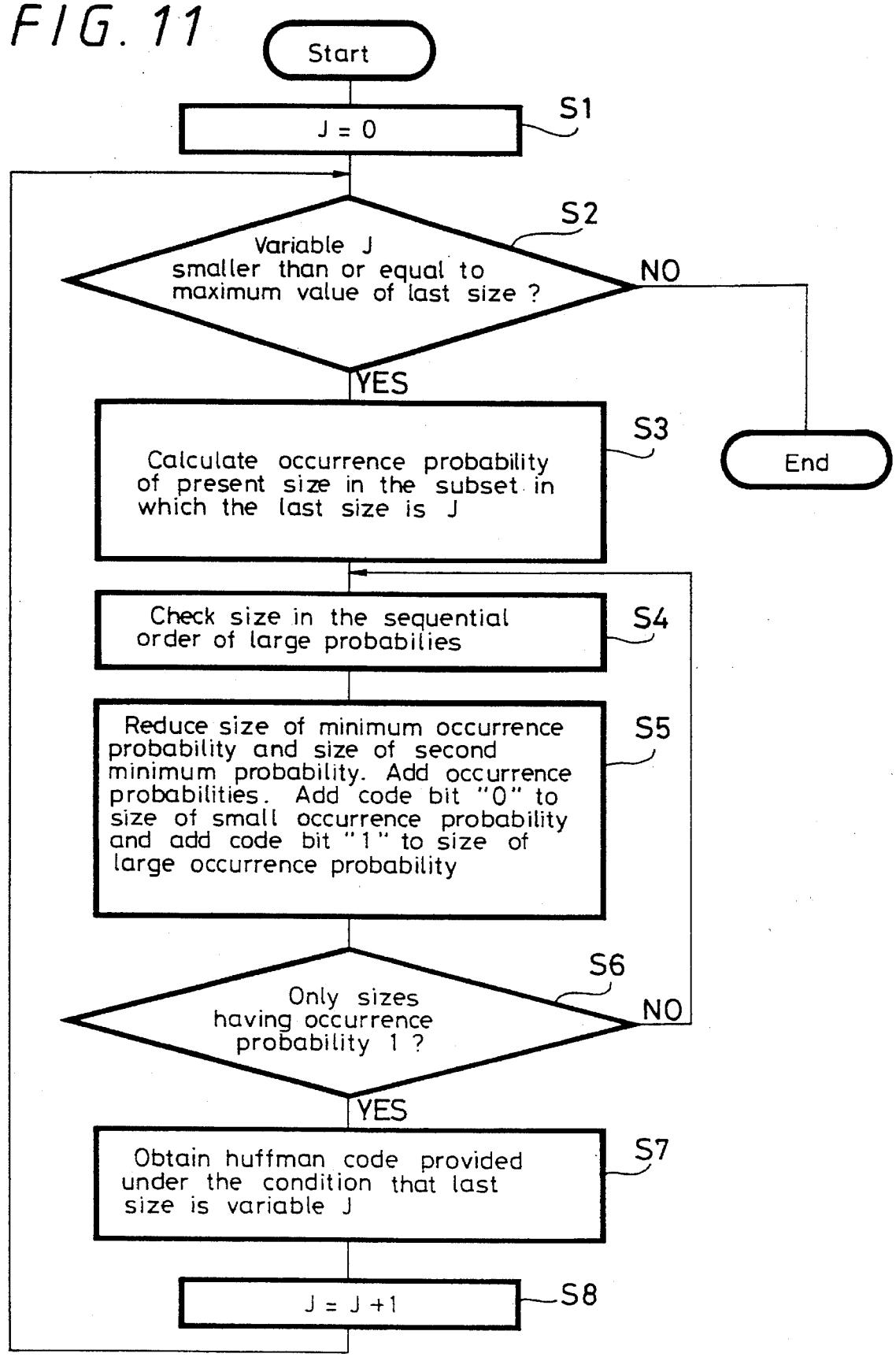
FIG. 11 is a flowchart used to explain an operation for making tables corresponding to condition series.

As shown in FIG. 11, following the start of operation, a variable J is set to "0", J represents a value of the size at step S1, and the processing proceeds to decision step S2. More specifically, occurrence frequency detector 15 shown in FIGS. 5 and 6 sets the variable J to "0".

It is determined in decision step S2 whether or not the variable J is smaller than or equal to the maximum value of the last size. If a YES is output at decision step S2, then the processing proceeds to step S3. If a NO is output at decision step S2, then this table making processing is ended. In this embodiment, "maximum value of last size" is the maximum value of the size used when a table is made before the current processing operation begins, and is not the maximum value of the size used in this processing.

In step S3, an occurrence probability of the present size in the subset in which the last size is J is calculated. Then, the processing proceeds to step S4.

In step S4, the sizes are sequentially checked in the order of large occurrence probabilities, and then the processing proceeds to step S5.

In step S5, the size of the minimum occurrence probability and the size of the second minimum occurrence probability are reduced and then replaced with new sizes. Then, occurrence probabilities thereof are added. A code bit "0" is added to the size of the small occurrence probability and a code bit "1" is added to the size of the large occurrence probability. Then, the processing proceeds to step S6.

It is determined in decision step S6 whether or not there are only sizes having an occurrence probability 1. If a YES is output at decision step S6, then the processing proceeds to step S7. If a NO is output at decision step S6, then the processing returns to step S4.

In step S7, a Huffman code provided under the condition that the last size is the variable J is obtained. Then, the processing proceeds to step S8.

In step S8, 1 is added to the variable J, and then the processing returns to step S2.

Referring back to FIG. 7, the coding that is carried out when the condition series is the size will be described below. In the following description, only the coefficient data and "code 1" to "code 13" shown in FIG. 7 are referred to, the arrows which associate the coefficient data with the "code 1" to "code 13" and the brackets of the respective coefficient data are not referred to.

The coefficient data AC01 provided as the leading AC component has a value "120" and the size thereof is "7", as can be understood from the tables shown in FIGS. 7 and 10. As earlier described in the example in which "0 run, value" is used as the condition series, the coefficient data AC01 is provided as the leading AC component. Therefore, as shown in FIG. 26, variable length codes are assigned to the leading coefficient data based on the table formed of the sizes of the present coefficient data and the variable length codes assigned according to these sizes. That is, this table is used to assign variable length codes to the coefficient data provided as the leading AC component.

More specifically, since the coefficient AC01 provided as the leading AC component is "120", the size "7" is obtained from the table shown in FIG. 10. Also, since the coefficient AC01 is provided as the leading AC component, the variable length code "111110" corresponding to the size "7" of the present coefficient data is obtained from FIG. 26. Then, data representing the sequential order of "120", in the table shown in FIG. 10 is added to this code.

Data representing the sequential order of values are counted from 0th data as in the order of 0th data, 1st data, 2nd data, ... A bit length which is the same as the value of the "size" is required to represent the sequential order of the coefficient data. In the case of the coefficient data with the size "7", for example, a bit length of data representing the sequential order of the size "7" is 7 bits.

Data representing the sequential order of values will be described in practice. As shown in FIG. 10, the size of the value "120", of the coefficient data AC01 is "7" and 0th value of the size "7" is "–127". Therefore, "120" is counted in the sequential order of –127, –126, .... –64, 64, 65, ... , 120. In this case, "120" is the 120th value, i.e., "1111000" and thus the coded output of the value "120" of the coefficient data AC01 becomes "111110 1111000".

The next AC component coefficient data AC10 is "50" and the size thereof is "6" from the table shown in FIG. 10. However, the size of the AC component coefficient data AC01 provided just before the AC component coefficient data AC10 is "7". Therefore, a table representing the size "7" of the preceding AC component coefficient data as shown in FIG. 19 is selected and a variable length code "01" corresponding to the size "6" of the present coefficient data on the table shown in FIG. 19 is assigned to the coefficient data.

Then, data representing the sequential order of value "50" on the table shown in FIG. 10 is added to this code. The size of the value "50" is "6" and the 0th value of the size "6" is "−63" and the value "50" is counted in the sequential order of −63, −62, ..., −32, 32, 33, ... 63. Thus, in this case, data representing the 50th value is added to the code.

The next AC component coefficient data AC20 is "10" and the size thereof is "4" from the table shown in FIG. 10. The size of the AC coefficient data AC10 provided just before the AC component coefficient data AC20 is "6". Therefore, a table of the size "6" of the preceding coefficient data as shown in FIG. 18 is selected and a variable length code "00" corresponding to the size "4" of the present coefficient data on the table shown in FIG. 18 is assigned to the coefficient data. Then, data representing the sequential order of the value "10" on the table shown in FIG. 10 is added to this code. The size of the value "10" is "4", and 0th value of the size "4", is "−15". Thus, the value "10" is counted in the sequential order of −15, −4, ..., −8, 8, 9, ..., 15. In this case, data representing the 10th value is added to the code.

The next AC component coefficient data AC11 is "20", and the size thereof is "5" from the table shown in FIG. 10. The size of the AC component coefficient data AC20 provided just before the AC component coefficient data AC11 is "4". Therefore, a table of the size "4" of the preceding AC component coefficient data as shown in FIG. 16 is selected and a variable length code "110" corresponding to the size "5" of the present coefficient data on the table shown in FIG. 16 is assigned to the coefficient data. Then, data representing the sequential order of the value "20" on the table shown in FIG. 10 is added to this code. The size of the value "20" is "5" and 0th value of the size "5" is "−31". Thus, the value "20" is counted in the sequential order of −31, −30, ..., −16, 16, 17, ..., 31. In this case, data representing the 20th value is added to the code.

The next AC component coefficient data AC02 is "30", and the size thereof is "5" from the table shown in FIG. 10. The size of the AC component coefficient data AC11 provided just before the AC component coefficient data AC02 is "5". Therefore, a table of the size "5" of the preceding AC component coefficient data as shown in FIG. 17 is selected and a variable length code "10" corresponding to the size "5" of the AC component coefficient data on the table shown in FIG. 17 is assigned to the coefficient data. Thus, data representing the sequential order of the value "30" on the table shown in FIG. 10 is added to this code. The size of the value "30" is "5", and the 0th value of the size "5" is "−31". Thus, the value "30", is counted in the sequential order of −31, −30, ..., −16, 16, 17, ..., 31. In this case, data representing the 30th value is added to the code.

The next AC component coefficient data AC03 is "41", and the size thereof is "6" from the table shown in FIG. 10. The size of the AC component coefficient data AC02 provided just before the AC component coefficient data AC03 is "5". Therefore, a table of the size "5" of the preceding AC component coefficient data as shown in FIG. 17 is selected, and a variable length code "111110" corresponding to the size "6", of the present coefficient data on the table shown in FIG. 17 is assigned to the coefficient data. Thus, data representing the sequential order of the value "41" on the table shown in FIG. 10 is added to this code. The size of the value "41" is "6" and the 0th value of the size "6" is "−63". Thus, the value "63" is counted in the sequential order of −63, −62, ..., −32, 32, 33, ..., 63. In this case, data representing the 41st value is added to the code.

The next AC component coefficient data AC12 is "10" and the size thereof is "4" from the table shown in FIG. 10. The size of the AC component coefficient data AC03 provided just before the AC component coefficient data AC12 is "6". Therefore, a table of the size "6" of the preceding AC component coefficient data as shown in FIG. 18 is selected and a variable length code "00" corresponding to the size "4" of the present AC component coefficient data on the table shown in FIG. 18 is assigned to the coefficient data. Thus, data representing the sequential order of the value "10" on the table shown in FIG. 10 is added to the code. The size of the value "10" is "4" and 0th value of the size "4" is "−15". Thus, the value "10" is counted in the sequential order of −15, −14, ..., −8, 8, 9, ..., 15. In this case, data representing the 10th value is added to the code.

The next AC component coefficient data AC21 is "10" and the size thereof is "4" from the table shown in FIG. 10. The size of the AC component coefficient data AC12 provided before the AC component coefficient data AC21 is "4". Therefore, a table of the size "4" of the preceding AC component coefficient data as shown in FIG. 16 is selected, and a variable length code "10" corresponding to the size "4" of the present AC component coefficient data on the table shown in FIG. 16 is assigned to the coefficient data. Thus, data representing the sequential order of the value "10" on the table shown in FIG. 10 is added to the code. Also in this case, the sequential order is 10, as described above.

The next AC component coefficient data AC30 is "3" and the size thereof is "2" from the table shown in FIG. 10. The size of the AC component coefficient data AC21 provided before the AC component coefficient data AC30 is "4". Therefore, a table of the size "4" of the preceding coefficient data shown in FIG. 16 is selected, and a variable length code "011" corresponding to the size "2" of the present AC component coefficient data on the table shown in FIG. 16 is assigned to the coefficient data. Thus, data representing the sequential order of the value "3" on the table shown in FIG. 10 is added to the code. The size of the value "3" is "2", and the 0th value of the size "2" is "−3". The value "3" is counted in the sequential order of −3, −2, 2, 3. In this case, data representing the 3rd value is added to the code.

The next AC component coefficient data AC31 is "1" and the size thereof is "1" from the table shown in FIG. 10. The size of the AC component coefficient data AC30 provided before the AC component coefficient data AC31 is "2". Therefore, a table of the size "2" of the preceding AC component coefficient data as shown in FIG. 14 is selected, and a variable length code "00" corresponding to the size "1" of the present AC component coefficient data on the table shown in FIG. 14 is assigned to the coefficient data. Thus, data representing the sequential order of the size "1" on the table shown in FIG. 10 is added to the code. The size of the value "1" is "1" and the 0th value of the value "1" is "−1". The value "1" is counted in the sequential order of −1, 1. Thus, data representing the first value would be added to the code; however, when the data representing the sequential order of the value "1" is the first value, the data need not be added to the code.

The next AC component coefficient data AC22 is "0" and the size thereof is "0" from the table shown in FIG. 10. The size of the AC component coefficient data AC31 provided just before the AC component coefficient data AC22 is "1". Therefore, a table of the size "1" of the preceding AC component coefficient data as shown in FIG. 13 is selected, and a variable length code "00", corresponding to the size "0" of the present AC component coefficient data on the table shown in FIG. 13 is assigned to the coefficient data. In this case, data representing the sequential order of the value "0" is not added to the code because the size "0" is combined with only "0" and data representing the sequential order of the value "0" itself is useless.

The next AC component coefficient data AC13 is "0" and the size thereof is "0" from the table shown in FIG. 10. The size of the AC component coefficient data AC22 provided just before the AC component coefficient data AC13 is "0". Therefore, a table of the size "0" of the preceding AC component coefficient data shown in FIG. 12 is selected, and a variable code "00" corresponding to the size "0" of the present AC component coefficient data on the table shown in FIG. 12 is assigned to the coefficient data. Similarly as described above, data representing the sequential order of the value "0" is not added to the code.

The next AC component coefficient data AC23 is "1" and the size thereof is "1" from the table shown in FIG. 10. The size of the AC component coefficient data AC13 provided just before the AC component coefficient data AC23 is "0". Therefore, a table of the size "0" of the preceding AC component coefficient data as shown in FIG. 12 is selected, and a variable length code "01" corresponding to the size "1" of the present AC component coefficient data on the table shown in FIG. 12 is assigned to the coefficient data. Data representing the sequential order of the value "1" on the table shown in FIG. 10 is added to the code. The size of the value "1" is "1" and the 0th value of the size "1" is "−1". The value "1" is counted in the sequential order of −1, 1. In this case, data representing the first value would be added to the code; however, when the data representing the sequential order of the value "1" is the first value, that data need not be added to the code.

The next AC component coefficient data AC32 is "1" and the size thereof is "1" from the table shown in FIG. 10. The size of the AC component coefficient data AC23 provided just before the AC component coefficient data AC32 is "1". Therefore, a table of the size "1" of the preceding AC component coefficient data as shown in FIG. 13 is selected, and a variable length code "01" corresponding to the size "1" of the present coefficient on the table shown in FIG. 13 is assigned to the coefficient data. Then, data representing the sequential order of the value "1" on the table shown in FIG. 10 is added to the code. Data representing the sequential order of the value "1" is the first value, as described above, and so need not be added to the code.

Then, the AC component coefficient data AC33 is "1" and the size thereof is "1" from the table shown in FIG. 10. The size of the AC component coefficient data AC32 provided just before the AC component coefficient data AC33 is "1". Therefore, a table of the size "1" of the preceding AC component coefficient data as shown in FIG. 13 is selected, and a variable length code "01" corresponding to the size "1" of the present coefficient data on the table shown in FIG. 13 is assigned to the coefficient data. Then, data representing the sequential order of the value "1" on the table shown in FIG. 10 is added to the code. Data representing the sequential order of the value "1" is the first value, as described above, and so need not be added to the code.

On the other hand, when the variable length code data is decoded by variable length code decoder 7, or when the size is used as the condition series, the table is selected based on the preceding AC component coefficient data and the encoded code data is decoded based on the selected table. As already described, data representing the sequential order of the value of the coefficient data on the table shown in FIG. 10 is added to the code data; therefore, the table shown in FIGS. 10 through 26 may be used as they are for decoding and coding. Alternatively, new tables may be formed by compressing these many tables so that these tables are used exclusively in decoding.

According to the coding method of the present invention, since data representing the sequential order of the values of the coefficient data on the table shown in FIG. 10 are added to the code data, the variable length code decoder 7 can easily decode the code data based on the tables shown in FIGS. 10 through 26 or by using the new tables which results from compressing the above-mentioned tables. Also, since the data representing the sequential order of the values of the coefficient data on the table shown in FIG. 10 are added to the code data even when the codes are the same, it is possible to easily obtain the coefficient data of that code by detecting the data representing the sequential order of the value of the coefficient data added to the code.

As described above, according to the embodiment of the present invention, the table in which the size is used as the condition series is formed by detecting the frequency at which the coefficient data quantized by quantizer 13 occurs. Huffman coder 14 codes data based on the table thus formed and the quantization coarseness of quantizer 13 is controlled by supplying the total code length data from the Huffman coder to the quantizer. A number of tables based on the condition series are formed by repeatedly carrying out the above-mentioned operation. The tables thus formed are loaded onto memory 4a of variable length coder 4 of the encoder in the high-efficiency coding apparatus. Thus, when coefficient data is coded by the high-efficiency coding apparatus, the table corresponding to the size of the coefficient data provided just before the present coefficient data to be coded is selected and present coefficient data is coded based on the selected table. Therefore, the total code length can be decreased. Further, according to the embodiment of the present invention, since the data representing the sequential order of the value of the coefficient data is added to the coded coefficient data, the coded data can be decoded by a simple arrangement and with simple processing.

Having described the preferred embodiments of the invention with reference to the accompanying drawings, it is to be understood that the invention is not limited to these precise embodiments and that various changes and modifications could be effected therein by one skilled in the art without departing from the spirit or scope of the invention as defined in the appended claims.

What is claimed is:

1. A coding apparatus for coding a digital signal, comprising:

converting means for converting said digital signal into a data series formed of consecutive zero coefficients and non-zero coefficients;

classifying means for classifying each of said non-zero coefficients into a size grouping based on the value of said non-zero coefficients;

a plurality of tables, one for each of said size groupings, including code words of variable length for each respective next size grouping, wherein the length of each of said code words varies depending upon a correlation between said next size grouping and a preceding size grouping; and coding means for coding said next size grouping based on a code word from said table corresponding to said preceding size grouping.

2. A coding apparatus according to claim 1, wherein said digital signal is a digital video signal.

3. A coding apparatus according to claim 1, wherein said converting means performs a discrete cosine transform on said digital signal to form said data series.

4. A coding apparatus according to claim 1, further comprising means for combining successive code words to form a code of variable length; and wherein said converting means includes variable quantization means for quantizing said digital signal using a quantization step size based on the length of said code.

5. A coding apparatus according to claim 1, wherein said coding means includes means for adding to said selected code word sequential order information from said size grouping representing a value of a current non-zero coefficient.

6. A coding apparatus for generating coding tables, comprising:

converting means for converting an orthogonally transformed digital signal into a data series formed of consecutive zero coefficients and non-zero coefficients;

classifying means for classifying each of said non-zero coefficients into a size grouping based on the value of said non-zero coefficient; and generating means for generating a plurality of tables, one for each of said size groupings, based on an occurrence frequency of a next size grouping following a preceding size grouping, wherein said table includes a variable length code word for each of said next size groupings, the length of each said code words being dependent upon a correlation between said preceding size grouping and said next size grouping.

7. A coding method for coding a digital signal, comprising the steps of:

converting said digital signal into a data series formed of consecutive zero coefficients and non-zero coefficients;

classifying each of said non-zero coefficients into a size grouping based on the value of said non-zero coefficient; and coding a next size grouping by using a code word selected from one of a plurality of tables of data, each table corresponding to a preceding size grouping and including code words of variable length for each respective next size grouping, wherein the length of each of said code words varies depending upon a correlation between said preceding size grouping and said next size grouping, said code word is selected for said next size grouping based on the table corresponding to said preceding size grouping.

8. A coding method according to claim 7, wherein said digital signal is a digital video signal.

9. A coding method according to claim 7, wherein said step of converting includes performing a discrete cosine transform.

10. A coding method according to claim 7, further comprising the step of combining successive code words to form a code of variable length, and wherein said step of converting includes the step of variably quantizing said digital signal using a quantization step size based on the length of said code.

11. A coding method according to claim 7, further comprising the step of adding to the selected code word sequential order information from said size grouping representing the value of a current non-zero coefficient.

12. A coding method for generating coding tables, comprising the steps of:

converting a digital signal into a data series formed of zero coefficients and non-zero coefficients;

classifying each of said non-zero coefficients into a size grouping based on the value of said non-zero coefficient; and generating a plurality of tables, one for each of said size groupings, based on an occurrence frequency of a next size grouping following a preceding size grouping, wherein said table includes a variable length code word for each of said next size groupings, the length of each said code words being dependent upon a correlation between said preceding size grouping and said next size grouping.

* * * * *